(12) United States Patent
Wright et al.

(10) Patent No.: US 7,678,526 B2
(45) Date of Patent: **\*Mar. 16, 2010**

(54) RADIATION CURABLE THERMAL TRANSFER ELEMENTS

(75) Inventors: Robin E. Wright, Inver Grove Heights, MN (US); Khanh T. Huynh, Eagan, MN (US); Leslie A. Kreilich, Saint Paul, MN (US); Lan H. Liu, Rosemount, MN (US); Rachel K. Swanson, Saint Paul, MN (US); Richard L. Walter, Saint Paul, MN (US); Martin B Wolk, Woodbury, MN (US); Stephen A. Johnson, Woodbury, MN (US); William A. Tolbert, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/114,019

(22) Filed: May 2, 2008

(65) Prior Publication Data

US 2008/0241733 A1  Oct. 2, 2008

Related U.S. Application Data

(63) Continuation-in-part of application No. 11/246,811, filed on Oct. 7, 2005, now Pat. No. 7,396,631.

(51) Int. Cl.
*G03C 8/00* (2006.01)
(52) U.S. Cl. .................... 430/200; 430/201; 430/964
(58) Field of Classification Search ............ 430/200, 430/201, 964; 427/514; 428/32.8
See application file for complete search history.

(56) References Cited

U.S. PATENT DOCUMENTS

| 3,795,814 | A | 3/1974 | Rabtin |
| 3,859,527 | A | 1/1975 | Luckey |
| 3,883,747 | A | 5/1975 | Murashige et al. |
| 3,974,389 | A | 8/1976 | Ferri et al. |
| 4,204,125 | A | 5/1980 | Fatuzzo et al. |
| 4,225,653 | A | 9/1980 | Brixner |

(Continued)

FOREIGN PATENT DOCUMENTS

EP           0 021 174           1/1981

(Continued)

OTHER PUBLICATIONS

"Luminescent Materials", *Ullmann's Encyclopedia of Industrial Chemistry*, 5th Ed., vol. A15, p. 539-554 (1990).

(Continued)

*Primary Examiner*—Thorl Chea

(57) ABSTRACT

Radiation curable thermal transfer elements including a substrate and a light-to-heat conversion layer overlaying the substrate, and processes to make the thermal transfer elements. The light-to-heat conversion layer is derived from a radiation curable material capable of being cured by exposure to radiation at a curing wavelength and an imaging radiation absorber material not substantially increasing radiation absorbance at the curing wavelength. The radiation curable transfer elements can be used in processes for making organic microelectronic devices.

3 Claims, 2 Drawing Sheets

U.S. PATENT DOCUMENTS

| | | | |
|---|---|---|---|
| 4,249,011 A | 2/1981 | Wendling | |
| 4,252,671 A | 2/1981 | Smith | |
| 4,258,264 A | 3/1981 | Kotera et al. | |
| 4,261,854 A | 4/1981 | Kotera et al. | |
| 4,262,072 A | 4/1981 | Wendling et al. | |
| 4,387,141 A | 6/1983 | Patten | |
| 4,405,691 A | 9/1983 | Yale | |
| 4,430,366 A | 2/1984 | Crawford et al. | |
| 4,598,207 A | 7/1986 | Naruse et al. | |
| 4,599,298 A | 7/1986 | Fisch | |
| 4,652,462 A | 3/1987 | Nishizawa et al. | |
| 4,717,219 A | 1/1988 | Frantz et al. | |
| 4,772,583 A | 9/1988 | Sprecker et al. | |
| 4,822,643 A | 4/1989 | Chou et al. | |
| 4,833,124 A | 5/1989 | Lum | |
| 4,839,224 A | 6/1989 | Chou et al. | |
| 4,912,083 A | 3/1990 | Chapman et al. | |
| 4,940,640 A | 7/1990 | MacDiarmid | |
| 4,942,141 A | 7/1990 | DeBoer et al. | |
| 4,948,776 A | 8/1990 | Evans et al. | |
| 4,948,777 A | 8/1990 | Evans et al. | |
| 4,948,778 A | 8/1990 | DeBoer | |
| 4,950,639 A | 8/1990 | DeBoer et al. | |
| 4,952,552 A | 8/1990 | Chapman et al. | |
| 4,973,572 A | 11/1990 | DeBoer | |
| 5,023,229 A | 6/1991 | Evans et al. | |
| 5,024,990 A | 6/1991 | Chapman et al. | |
| 5,089,372 A | 2/1992 | Kirihata et al. | |
| 5,124,564 A | 6/1992 | Fouassier et al. | |
| 5,156,938 A | 10/1992 | Foley et al. | |
| 5,164,224 A | 11/1992 | Kojima et al. | |
| 5,166,024 A | 11/1992 | Bugner et al. | |
| 5,171,650 A | 12/1992 | Ellis et al. | |
| 5,256,506 A | 10/1993 | Ellis et al. | |
| 5,278,023 A | 1/1994 | Bills et al. | |
| 5,286,604 A | 2/1994 | Simmons, III | |
| 5,296,117 A | 3/1994 | De Jaeger et al. | |
| 5,302,423 A | 4/1994 | Tran et al. | |
| 5,306,637 A | 4/1994 | Lin et al. | |
| 5,308,737 A | 5/1994 | Bills et al. | |
| 5,340,699 A | 8/1994 | Haley et al. | |
| 5,351,617 A | 10/1994 | Williams et al. | |
| 5,360,694 A | 11/1994 | Thien et al. | |
| 5,401,606 A | 3/1995 | Reardon et al. | |
| 5,401,607 A | 3/1995 | Takiff et al. | |
| 5,501,937 A | 3/1996 | Matsumoto et al. | |
| 5,516,622 A | 5/1996 | Savini | |
| 5,534,383 A | 7/1996 | Takahashi et al. | |
| 5,725,989 A | 3/1998 | Chang et al. | |
| 5,856,064 A | 1/1999 | Chou | |
| 5,981,136 A | 11/1999 | Chang et al. | |
| 6,066,729 A | 5/2000 | Fujita et al. | |
| 6,099,994 A | 8/2000 | Chang et al. | |
| 6,156,478 A | 12/2000 | Liu et al. | |
| 6,190,826 B1 | 2/2001 | Chang et al. | |
| 6,214,520 B1 | 4/2001 | Wolk et al. | |
| 6,242,152 B1 | 6/2001 | Staral et al. | |
| 6,270,934 B1 | 8/2001 | Chang et al. | |
| 6,461,793 B2 | 10/2002 | Chang et al. | |
| 6,468,715 B2 | 10/2002 | Hoffend et al. | |
| 6,541,420 B2 | 4/2003 | Yamamoto et al. | |
| 6,582,877 B2 | 6/2003 | Chang et al. | |
| 6,682,863 B2 | 1/2004 | Rivers et al. | |
| 6,811,938 B2 | 11/2004 | Tutt et al. | |
| 6,866,979 B2 | 3/2005 | Chang et al. | |
| 7,396,631 B2 * | 7/2008 | Wright et al. | 430/200 |
| 2001/0055733 A1 * | 12/2001 | Irie et al. | 430/396 |
| 2002/0086232 A1 * | 7/2002 | Nirmal et al. | 430/200 |
| 2004/0191564 A1 | 9/2004 | Kim et al. | |
| 2005/0003285 A1 | 1/2005 | Hayashi et al. | |
| 2005/0118362 A1 | 6/2005 | Kim et al. | |
| 2005/0118525 A1 | 6/2005 | Kim et al. | |
| 2005/0136344 A1 | 6/2005 | Kang et al. | |
| 2005/0287315 A1 | 12/2005 | Kreilich et al. | |
| 2006/0046196 A1 | 3/2006 | Hunter et al. | |

FOREIGN PATENT DOCUMENTS

| | | |
|---|---|---|
| EP | 0 175 578 | 3/1986 |
| EP | 0 568 993 | 11/1993 |
| EP | 0 641 008 | 1/1995 |
| GB | 2 083 726 | 3/1982 |
| JP | 55-146447 | 11/1980 |
| JP | 59-020466 | 2/1984 |
| JP | 61-252501 | 11/1986 |
| JP | 62-67416 | 3/1987 |
| JP | 62-95670 | 5/1987 |
| JP | 63-089385 | 4/1988 |
| JP | 64-14081 | 1/1989 |
| JP | 02-162095 | 6/1990 |
| JP | 02-162095 | 6/1992 |
| JP | 05-338358 | 12/1993 |
| JP | 06-219052 | 8/1994 |
| JP | 07-104113 | 4/1995 |
| JP | 08-267943 | 10/1996 |
| JP | 2000-033780 | 2/2000 |
| WO | WO 94/22674 | 10/1994 |
| WO | WO 95/13195 | 5/1995 |
| WO | WO 96/02010 | 1/1996 |

OTHER PUBLICATIONS

Bello, K.A. et al., "Near-Infrared-absorbing Squaraine Dyes containing 2,3-Dihydroperimidine Terminal Groups", *J. Chem. Socl, Chem-Commun.*, p. 452-4 (1993).

Chuang, T.J. et al., "Laser-Photoetching Characteristics of Polymers with Dopants", *Appl. Phys. A*, 45, p. 277-288 (1988).

Curtin, C., et al., *Fundamentals of Emissive Technology*, Society for Information Display, ISSN 0097-966X, May 1997, pp. 3.

Hase, T. et al., "Phosphor Materials for Cathode-Ray Tubes," *Advances in Electronic and Electron Physics*, Academic Press, Inc., New York, 79, 271 (1990), pp. 271-373.

Irie et al., "Thermal Transfer Color Printing Using Laser Heating", *Journal of Imaging Science and Technology*, 37, 235-238 (May/Jun. 1993).

Matsuoka, M., Absorption Spectra of Dyes For Diode Lasers, Bunshin Publishing Co., Tokyo, 1990.

Matsuoka, M., Infrared Absorbing Dyes, Plenum Press, New York, 1990.

Mitsuru, I., et al., "Thermal Transfer Color Printing Using Laser Heating", *Journal of Imaging Science and Technology*, vol. 37, May/Jun. 1993, pp. 235-238.

Oki, K., et al., "A Phosphor Screen for High-Resolution CRTs", *Journal of the SID*, vol. 3, No. 51 (1995), pp. 51-57.

Raue, R., et al., "Phosphor Screens in Cathode-Ray Tubes for Projection Television", *Philips Tech. Rev.*, vol. 44, No. 11/12, p. 335-347 (Nov. 1989).

Chang et al., "Laser Addressable Thermal Transfer Imaging Element with an Interlayer", U.S. Appl. No. 11/272,240, filed Nov. 10, 2005.

* cited by examiner

RADIATION CURABLE THERMAL TRANSFER ELEMENTS

REFERENCE TO RELATED APPLICATION

The present application is a continuation-in-part of U.S. patent application Ser. No. 11/246,811, filed Oct. 7, 2005, now U.S. Pat. No. 7,396,631 which is incorporated herein by reference as if fully set forth.

FIELD OF INVENTION

The present invention relates to thermal transfer elements, particularly to radiation curable thermal transfer elements useful in laser induced thermal imaging (LITI) or other imaging processes. The present invention further relates to methods for fabricating and using radiation cured thermal transfer elements to fabricate organic microelectronic devices.

BACKGROUND

Many miniature electronic and optical devices are formed using layers of different materials stacked on each other. Examples of such devices include optical displays in which each pixel is formed in a patterned array, optical waveguide structures for telecommunication devices, and metal-insulator-metal stacks for semiconductor-based devices. A conventional method for making these devices includes forming one or more layers on a receptor substrate and patterning the layers simultaneously or sequentially to form the device. Patterning of the layers is often performed by photolithographic techniques that include, for example, covering a layer with a photoresist, patterning the photoresist by exposure to radiation through a mask, removing a portion of either the exposed or non-exposed photoresist to reveal the underlying layer according to the pattern, and then etching the exposed layer.

In many cases, multiple deposition and patterning steps are required to prepare the ultimate device structure. For example, the preparation of optical displays may require the separate formation of red, green, and blue pixels. Although layers may be commonly deposited for each of these types of pixels, some layers must be separately formed and often separately patterned. In some applications, it may be difficult or impractical to produce devices using conventional photolithographic patterning. There is thus a need for new methods of forming these devices. In at least some instances, this may allow for the construction of devices with more reliability and more complexity.

LITI has been developed as an alternative patterning method for multilayer microelectronic and optical devices. LITI is a digital patterning method involving the transfer of materials from a donor sheet to a receptor surface. LITI methods generally include pattern-wise printing of one or more transfer layers for display applications. LITI patterning methods typically use a multi-layer thermal transfer donor film that is pattern-wise exposed by a source of radiation (e.g., an infrared laser or flashlamp exposing through a mask) to transfer a patterned transfer layer from the donor film to a desired substrate.

SUMMARY

A first embodiment includes a radiation curable thermal transfer element including a substrate and a light-to-heat conversion (LTHC) layer overlaying the substrate. The LTHC layer is derived from a radiation curable material capable of being cured by exposure to radiation at a curing wavelength or wavelengths, and an imaging radiation absorber material that does not substantially increase radiation absorption at the curing wavelength or within the range of curing wavelengths.

A second embodiment includes a radiation curable thermal transfer element including a substrate and an LTHC layer overlaying the substrate. The LTHC layer contains a radiation curable material capable of being cured by exposure to radiation at a curing wavelength or wavelengths, and an imaging radiation absorber material which does not substantially increase radiation absorption at the curing wavelength or within the range of curing wavelengths prior to curing of the radiation curable material.

A third embodiment includes a thermal transfer element cured by exposure to radiation at a curing wavelength or wavelengths and including a substrate and an LTHC layer overlaying the substrate. The LTHC layer is derived from a radiation curable material and an imaging radiation absorber material which does not substantially increase radiation absorption at the curing wavelength or within the range of curing wavelengths. The amount of residual curable material is substantially less than the amount of residual curable material present in a thermal transfer element having comparable imaging radiation absorption and thickness in which the imaging radiation absorber material is replaced with a small particle absorber material cured under the same conditions.

A fourth embodiment includes a thermal transfer element cured by exposure to radiation at a curing wavelength or wavelengths and including a substrate and an LTHC layer overlaying the substrate. The LTHC layer is derived from a radiation curable material and an imaging radiation absorber material which does not substantially increase radiation absorption at the curing wavelength or within the range of curing wavelengths. The amount of residual curable material is substantially less than the amount of residual curable material present in a thermal transfer element including a small particle absorber material.

A fifth embodiment includes a process for making a thermal transfer element including a substrate and an LTHC layer overlaying the substrate and derived from a radiation curable material and an imaging radiation absorber material which does not substantially increase radiation absorption at a curing wavelength or wavelengths, including the steps of coating the LTHC layer on the substrate, and curing the radiation curable material such that the imaging radiation absorber material does not substantially increase radiation absorption at a curing wavelength or within the range of curing wavelengths.

A sixth embodiment includes a process for making an organic microelectronic device including the steps of providing a thermal transfer element including a substrate and an LTHC layer overlaying the substrate, the LTHC derived from a radiation curable material capable of being cured by exposure to radiation at a curing wavelength or wavelengths, and an imaging radiation absorber material which does not substantially increase radiation absorption at the curing wavelength or within the range of curing wavelengths; placing the thermal transfer element and a receptor in intimate contact; exposing the thermal transfer element in an image-wise pattern with a source of near infrared radiation; and transferring at least a portion of the thermal transfer element corresponding to the image-wise pattern to the receptor to form an organic microelectronic device.

BRIEF DESCRIPTION OF THE DRAWINGS

The invention may be more completely understood in the following detailed description of various embodiments of the invention in connection with the accompanying drawings, in which.

DETAILED DESCRIPTION

The present specification relates to patterning methods for LITI transfer layers used in LITI donor films. The LITI donor films may be used in the formation or partial formation of devices and other objects using thermal transfer and thermal transfer elements for forming the devices or other articles. As a particular example, a thermal transfer element can be formed for making, at least in part, a multilayer device, such as a multilayer active device and passive device, for example as multilayer electronic and optical devices. This process can be accomplished, for example, by thermal transfer of a multi-component transfer assembly from a thermal transfer element to a final receptor. It will be recognized that single layer and other multilayer transfers can also be used to form devices and other articles.

An order in the present specification (e.g., an order of steps to be performed or an order of layers on a substrate) is not meant to preclude intermediates between the items specified. Furthermore, as used herein:

The term "active device" includes an electronic or optical component capable of a dynamic function, such as amplification, oscillation, or signal control, and may require a power supply for operation.

The term "curing wavelength" includes a wavelength or range of wavelengths that upon absorption within the LTHC layer is capable of initiating polymerization and/or crosslinking of the radiation curable material.

The term "imaging wavelength" includes a wavelength or range of wavelengths emitted by the imaging source.

The term "microelectronic device" includes an electronic or optical component that can be used alone and/or with other components to form a larger system, such as an electronic circuit.

The term "passive device" includes an electronic or optical component that is basically static in operation (i.e., it is ordinarily incapable of amplification or oscillation) and may require no power for characteristic operation.

The term "small particle absorber" includes an absorber that provides for absorption and scattering of light by small particles as described in, for example, the following text: C. F. Bohren and D. R. Huffman, Absorption and Scattering of Light by Small Particles, John Wiley & Sons, Inc., Library of Congress ISBN 0-471-29340-7 (1983), incorporated herein by reference.

Thermal Transfer Elements

Figure 1:
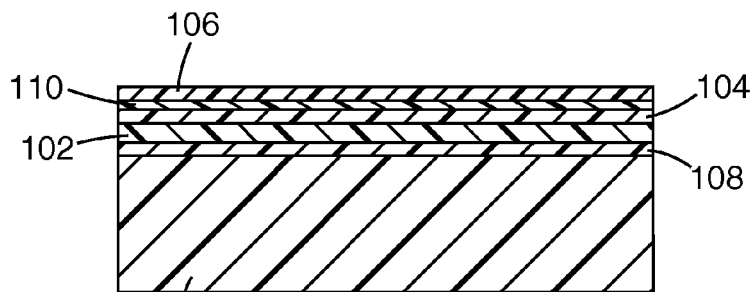
FIG. 1 is a cross-sectional diagram illustrating an exemplary LITI donor film construction.

The present invention provides LITI donor films including radiation curable thermal transfer elements and methods of preparing radiation cured thermal transfer layers useful in fabricating microelectronic and optical devices, for example. As shown in FIG. 1, an exemplary LITI donor film includes a donor substrate 100 for mechanical support and an LTHC layer 102 overlaying the substrate 100 and used for transforming imaging power into heat. Other layers may include, for example, a transfer layer 106, an optional interlayer 104 overlaying the substrate, an optional underlayer 108 interposed between the substrate 100 and the LTHC layer 102, and an optional release layer 110 underlying the transfer layer.

Substrate and Optional Primer Layer

Generally, the LITI donor thermal transfer element includes a substrate. The donor substrate can be a polymer film. One suitable type of polymer film is a polyester film, for example, polyethylene terephthalate (PET) or polyethylene naphthalate (PEN) films. However, other films include those having appropriate optical properties if radiation of the donor is performed from the side opposite the receptor, including high transmission of light at a particular wavelength as well as sufficient mechanical and thermal stability for the particular application. In certain embodiments, the substrate may itself contain an imaging radiation absorber material, in which case a portion of the substrate such as the top layer, or the whole substrate (e.g., if the absorber is homogeneous throughout the substrate), can function as the LTHC layer. In that case, the substrate is optional in that the LTHC also functions as a substrate.

The donor substrate, in at least some instances, is substantially planar so that uniform coatings can be formed. The typical thickness of the donor substrate ranges from 0.025 millimeters (mm) to 0.15 mm, preferably 0.05 mm to 0.1 mm, although thicker or thinner donor substrates may be used.

Typically, the materials used to form the donor substrate and any adjacent layer(s) can be selected to improve adhesion between the donor substrate and the adjacent layer(s), control temperature transport between the substrate and the adjacent layer, and control imaging radiation transport to the LTHC layer. However, an optional priming layer can be used to increase uniformity during the coating of subsequent layers onto the substrate and also increase the bonding strength between the donor substrate and adjacent layers. One example of a suitable substrate with primer layer is Product No. M7Q (available from DuPont Teijin Films, Osaka, Japan).

Optional Underlayer

An optional underlayer may be coated or otherwise disposed between a donor substrate and the LTHC layer to minimize damage to the donor substrate during imaging, for example. The underlayer can also influence adhesion of the LTHC layer to the donor substrate element. Typically, the underlayer has high thermal resistance (i.e., a lower thermal conductivity than the substrate) and acts as a thermal insulator to protect the substrate from heat generated in the LTHC layer. Alternatively, an underlayer that has a higher thermal conductivity than the substrate can be used to enhance heat transport from the LTHC layer to the substrate, for example to reduce the occurrence of imaging defects that can be caused by LTHC layer overheating.

Suitable underlayers include, for example, polymer films, metal layers (e.g., vapor deposited metal layers), inorganic layers (e.g., sol-gel deposited layers and vapor deposited layers of inorganic oxides (e.g., silica, titania, aluminum oxide and other metal oxides)), and organic/inorganic composite layers. Organic materials suitable as underlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the donor substrate or LTHC layer as, for example, thermoplastic precursors and subsequently crosslinked to form a crosslinked underlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (e.g., solvent coating or spray coating). The underlayer may be either transmissive, absorptive, reflective, or some combination thereof, to one or more wavelengths of imaging radiation.

Inorganic materials suitable as underlayer materials include, for example, metals, metal oxides, metal sulfides, and inorganic carbon coatings, including those materials that are transmissive, absorptive, or reflective at the imaging light wavelength. These materials may be coated or otherwise applied via conventional techniques (e.g., vacuum sputtering, vacuum evaporation, or plasma jet deposition).

The underlayer may provide a number of benefits. For instance, the underlayer may be used to manage or control heat transport between the LTHC layer and the donor substrate. An underlayer may be used to insulate the substrate from heat generated in the LTHC layer or to absorb heat away from the LTHC layer toward the substrate. Temperature management and heat transport in the donor element can be accomplished by adding layers and/or by controlling layer properties such as thermal conductivity (e.g., either or both the value and the directionality of thermal conductivity), distribution and/or orientation of absorber material, or the morphology of layers or particles within layers (e.g., the orientation of crystal growth or grain formation in metallic thin film layers or particles).

The underlayer may contain additives, including, for example, photoinitiators, surfactants, pigments, plasticizers, and coating aids. The thickness of the underlayer may depend on factors such as, for example, the material of the underlayer, the material and optical properties of the LTHC layer, the material of the donor substrate, the wavelength of the imaging radiation, the duration of exposure of the thermal transfer element to imaging radiation, and the overall donor element construction. For a polymeric underlayer, the thickness of the underlayer typically is in the range of 0.05 micron to 10 microns, more preferably from about 0.1 micron to 4 microns, more preferably from about 0.5 micron to 3 microns, and more preferably from about 0.8 micron to 2 microns. For inorganic underlayers (e.g., metal or metal compound underlayer), the thickness of the underlayer typically is in the range of 0.005 micron to 10 microns, more preferably from about 0.01 micron to 4 microns, and more preferably from about 0.02 micron to 2 microns.

A more detailed description of LITI donor underlayers is found in U.S. Pat. No. 6,284,425, which is incorporated herein by reference.

Light-to-Heat Conversion (LTHC) Layers

For radiation-induced thermal transfer, an LTHC layer is incorporated within the thermal transfer donor to couple the energy of light radiated from a light-emitting source into the thermal transfer donor. The LTHC layer typically includes an imaging radiation absorber material that absorbs incident radiation and converts at least a portion of the incident radiation into heat to enable transfer of the transfer layer from the thermal transfer donor to the receptor. In some embodiments, the thermal transfer element includes an LTHC layer and also includes additional imaging radiation absorber material(s) disposed in one or more of the other layers of the thermal transfer donor, for example the donor substrate, a transfer layer, an optional interlayer, or an optional release layer.

Typically, the imaging radiation absorber material in the LTHC layer (or other layers) absorbs light in the infrared, visible, and/or ultraviolet regions of the electromagnetic spectrum, or within a particular range of wavelengths. The imaging radiation absorber material is absorptive of the selected imaging radiation and present in the thermal transfer element at a level sufficient to provide an optical absorbance at the wavelength of the imaging radiation in the range of 0.2 to 3, and preferably from 0.5 to 2. Typical radiation absorbing materials can include, for example, dyes (e.g., visible dyes, ultraviolet dyes, infrared dyes, fluorescent dyes, and radiation-polarizing dyes), pigments, organic pigments, inorganic pigments, metals, metal compounds, metal films, a ferricyanide pigment, a phthalocyanine pigment, a phthalocyanine dye, a cyanine pigment, a cyanine dye, and other absorbing materials.

Examples of typical imaging radiation absorber materials can include carbon black, metal oxides, and metal sulfides. One example of a typical LTHC layer can include a pigment such as carbon black, and a binder such as an organic polymer. Another typical LTHC layer can include metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques.

Dyes typical for use as imaging radiation absorber materials in an LTHC layer may be present in particulate form, dissolved in a binder material, or at least partially dispersed in a binder material. When dispersed particulate imaging radiation absorber materials are used, the particle size can be, at least in some instances, about 10 microns or less, and may be about 1 micron or less. Typical dyes include those dyes that absorb in the IR region of the spectrum. Examples of such dyes are described in the following: Matsuoka, M., "Infrared Absorbing Dyes," Plenum Press, New York, 1990; Matsuoka, M., Absorption Spectra of Dyes for Diode Lasers, Bunshin Publishing Co., Tokyo, 1990, U.S. Pat. Nos. 4,722,583; 4,833,124; 4,912,083; 4,942,141; 4,948,776; 4,948,778; 4,950,639; 4,940,640; 4,952,552; 5,023,229; 5,024,990; 5,156,938; 5,286,604; 5,340,699; 5,351,617; 5,360,694; and 5,401,607; European Patent Nos. 321,923 and 568,993; and Beilo, K. A. et al., J. Chem. Soc., Chem. Comm., 1993, 452-454 (1993), all of which are incorporated herein by reference. IR imaging radiation absorber materials include those marketed by Glendale Protective Technologies, Inc., Lakeland, Fla., under the designation CYASORB IR-99, IR-126 and IR-165. A specific dye may be chosen based on factors such as solubility in and compatibility with a specific binder and/or coating solvent, as well as the wavelength range of absorption.

Pigmentary materials may also be used in the LTHC layer as imaging radiation absorber materials. Examples of typical pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as lanthanum, aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-nano-structured oxides, and oxides structurally related to the bronze family (e.g., $WO_2$) may also be used.

Metal imaging radiation absorber materials may be used, either in the form of particulates as described for instance in U.S. Pat. No. 4,252,671, incorporated herein by reference, or as films as disclosed in U.S. Pat. No. 5,256,506, incorporated herein by reference. Typical metals include, for example, aluminum, bismuth, tin, indium, tellurium and zinc.

A particulate imaging radiation absorber material may be disposed in a binder. The weight percent of the imaging radiation absorber material in the coating, excluding the solvent in the calculation of weight percent, is generally from 1 wt. % to 30 wt. %, more preferably from 3 wt. % to 20 wt. %, and more preferably from 5 wt. % to 15 wt. %, depending on the particular imaging radiation absorber material(s) and binder(s) used in the LTHC.

LTHC layers known in the art generally include a UV-curable resin system and a carbon black pigment dispersion as a small particle absorber material. Carbon black is inexpensive, stable, easily processed, and absorbs at the NIR imaging laser wavelengths of 808 nanometers (nm) and 1064 nm. The spectral characteristics of carbon black generally result in LTHC layers that are difficult to UV cure and difficult to inspect optically during coating. In addition, the coatings are susceptible to thermal damage during the UV curing process due to the same light-to-heat conversion process that occurs during laser thermal printing. The UV lamp exposure includes power throughout the visible, where it is absorbed and converted to heat, even though the curing process is typically sensitized only in the UV. The result is often thermal damage and distortion of the film substrate.

Embodiments consistent with the present invention provide an LTHC layer containing an imaging radiation absorber material and a radiation curable material capable of being cured by exposure to radiation at a curing wavelength or wavelengths. In some embodiments the imaging radiation absorber material does not substantially increase radiation absorption at a curing wavelength or within a range of curing wavelengths. For example, in some embodiments the imaging radiation absorber material does not increase radiation absorbance at a curing wavelength or wavelengths by more than 50%, by more than 40%, by more than 30%, by more than 20%, by more than 10%, or by more than 5%, where the lesser the increase in radiation absorbance is more preferred. In other embodiments, the imaging radiation absorber material does not substantially increase radiation absorption at a curing wavelength or within a range of curing wavelengths prior to curing of the radiation curable material, more preferably by not more than 10% prior to the curing of the radiation curable material.

In other embodiments consistent with the present invention, an amount of residual unreacted curable material is substantially less than an amount of residual unreacted curable material present in a thermal transfer element having comparable optical density at the imaging wavelength and thickness in which the imaging radiation absorber material is replaced with a small particle absorber material cured under the same conditions. For example, in some embodiments, the amount of unreacted curable material present, in comparison to the small particle absorber, is less than 50%, less than 40%, less than 30%, less than 20%, less than 10%, or less than 5%, where the lesser the amount of unreacted curable material present is more preferred.

In other embodiments consistent with the present invention, an amount of residual unreacted curable material, after curing of the LTHC layer, is substantially less than an amount of residual unreacted curable material present in a thermal transfer element comprising a small particle absorber material. For example, in some embodiments, the amount of unreacted curable material present after curing of the LTHC layer, in comparison to the small particle absorber, is less than 50%, less than 40%, less than 30%, less than 20%, less than 10%, or less than 5%, where the lesser the amount of unreacted curable material present is more preferred.

An example of a small particle absorber material is carbon black as found in UV Pastes such as 9B981D, 9B950D and 9B923 from Penn Color (Doylestown, Pa.).

Suitable radiation curable materials include radiation curable monomers, oligomers, polymers and co(polymers), particularly acrylate and meth(acrylate) monomers, oligomers, polymers and co(polymers). Preferably, the radiation source used to effect curing of the radiation curable material emits radiation at a curing wavelength or wavelengths within the UV (200 nm-400 nm) or visible (400 nm-700 nm) radiation bands. In some embodiments, the radiation source used to effect curing may be a laser or a flash lamp.

The use of an NIR dye or pigment as the imaging radiation absorber material in the LTHC layer may offer a number of process and performance advantages in forming a radiation curable LTHC. First, many of the materials are more efficient imaging radiation absorber materials at the laser wavelength than other imaging radiation absorber materials that absorb significant radiation at a curing wavelength or wavelengths. This effect translates to being able to use a lower imaging radiation absorber material loading for a given laser power, potentially resulting in smoother surfaces. Second, the lack of substantial absorption in the visible spectrum, for certain LTHCs, prevents unwanted light to heat conversion during UV exposure and reduces the likelihood for thermal distortion of the coated film. Third, a more transparent spectral window in the visible will lead to improvements in the optical inspection process (detection of particulates and coating defects) during the LTHC and interlayer coatings, as well as during a final inspection of the donor film at the manufacturing site, the customer site, or elsewhere. Fourth, greater transparency in the visible region of the spectrum allows for alignment of the laser system to a high resolution receptor substrate (e.g., a display backplane) through the donor film. Such alignment can include maintaining registration between the donor film and the receptor substrate by scanning through the LTHC layer using a sensor to following a particular imaging (scanning) path based upon fiducial marks or other registration marks on the receptor substrate, as described in U.S. patent application Ser. No. 11/622,209, filed Jan. 11, 2007, and PCT Application No. 2007/088090, filed Dec. 19, 2007, both of which are incorporated herein by reference as if fully set forth. Fifth, greater visible transparency also allows for alignment of a pre-patterned donor film with a patterned receptor substrate. Finally, a transparent spectral window in the UV enables more efficient UV curing (lower residual concentration of unreacted radiation curable materials), shorter curing times (faster processing speeds), and lower UV lamp power settings (less thermal damage to the coated film).

In order to better understand the benefits of the imaging radiation absorber materials of the present invention in the LITI process, consider the optical properties in three spectral regions: the near-IR (NIR), visible (VIS), and ultraviolet (UV). The laser wavelength will typically fall in the NIR spectral region (700 nm-1100 nm). In order to be an efficient imaging radiation absorber material for a given type of laser, the non-small particle absorber material typically must have a significant absorption band at the laser wavelength. Preferred imaging radiation absorber material materials have effective extinction coefficients at the laser wavelength of at least $10^3$ mL/g-cm, preferably $10^4$ mL/g-cm, and more preferably $10^5$ mL/g-cm.

Thus, examples of imaging radiation absorber materials suitable for use with an 808 nanometer laser include Prussian Blue (Pigment Blue 27), copper phthalocyanine (Pigment Blue 15) and many of its substituted derivatives, and polymethine dyes. Suitable near IR (NIR) imaging radiation absorbers also include solvent soluble cyanine dyes such as S0402, S0337, S0391, S0094, S0325, S0260, S0712, S0726, S0455 and S0728 from FEW Chemicals (Wolfen, Germany); and YKR-2016, YKR-2100, YKR-2012, YKR-2900, D01-014 and D03-002 from Yamamoto Chemicals, Inc. (Tokyo, Japan) as well as soluble polymethine dyes such as Pro-Jet 830 LDI from Avecia (Blackley, Manchester, UK). Other imaging radiation absorbers useful in embodiments of the present invention include water soluble cyanine dyes such as S0121, S0270 and S0378 from FEW Chemicals and both soluble and insoluble phthalocyanine imaging radiation absorbers such as YKR-1020, YKR-220, YKR-1030, YKR-3020, YKR-3071, YKR-4010, YKR-3030, YKR-3070, YKR-369, D05-003 and YKR-5010 from Yamamoto and Pro-Jet 800 NP and Pro-Jet 830 NP from Avecia.

Figure 2A:
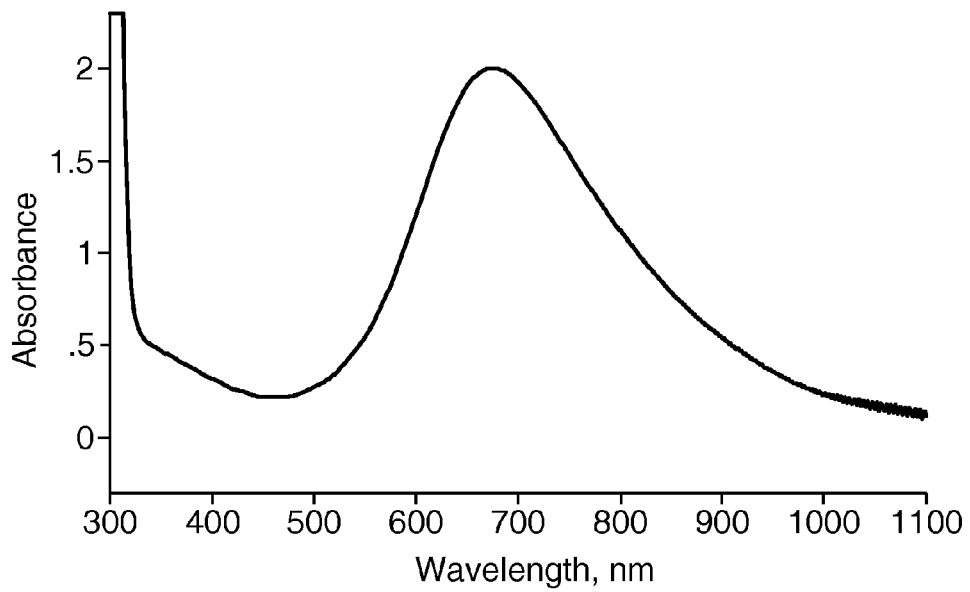
FIG. 2A is a graph illustrating a spectrum of Prussian Blue (Penn Color) in an LTHC layer.
Figure 2B:
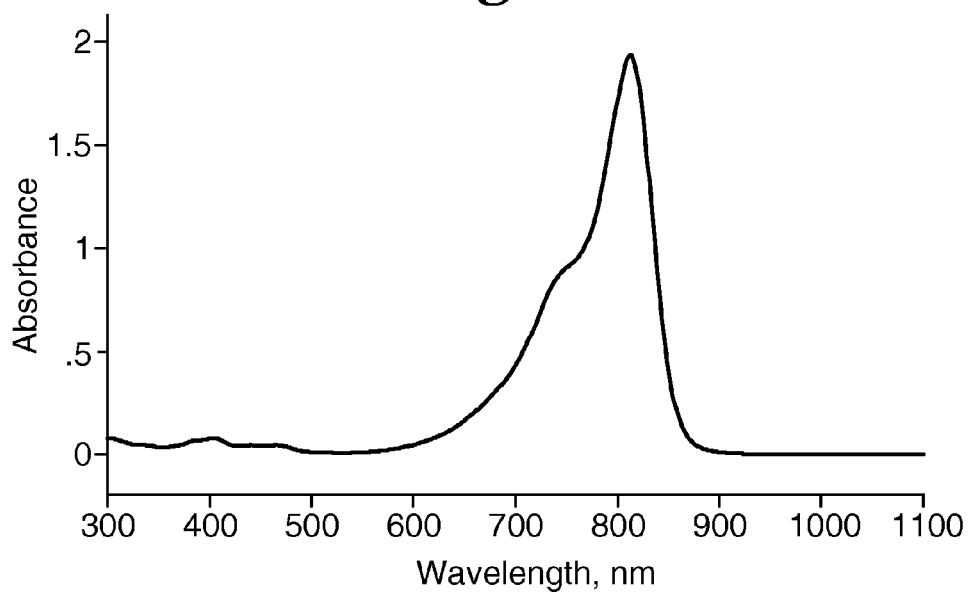
FIG. 2B is a graph illustrating a spectrum of Pro-Jet 830 LDI (Avecia) in an LTHC layer.
Figure 2C:
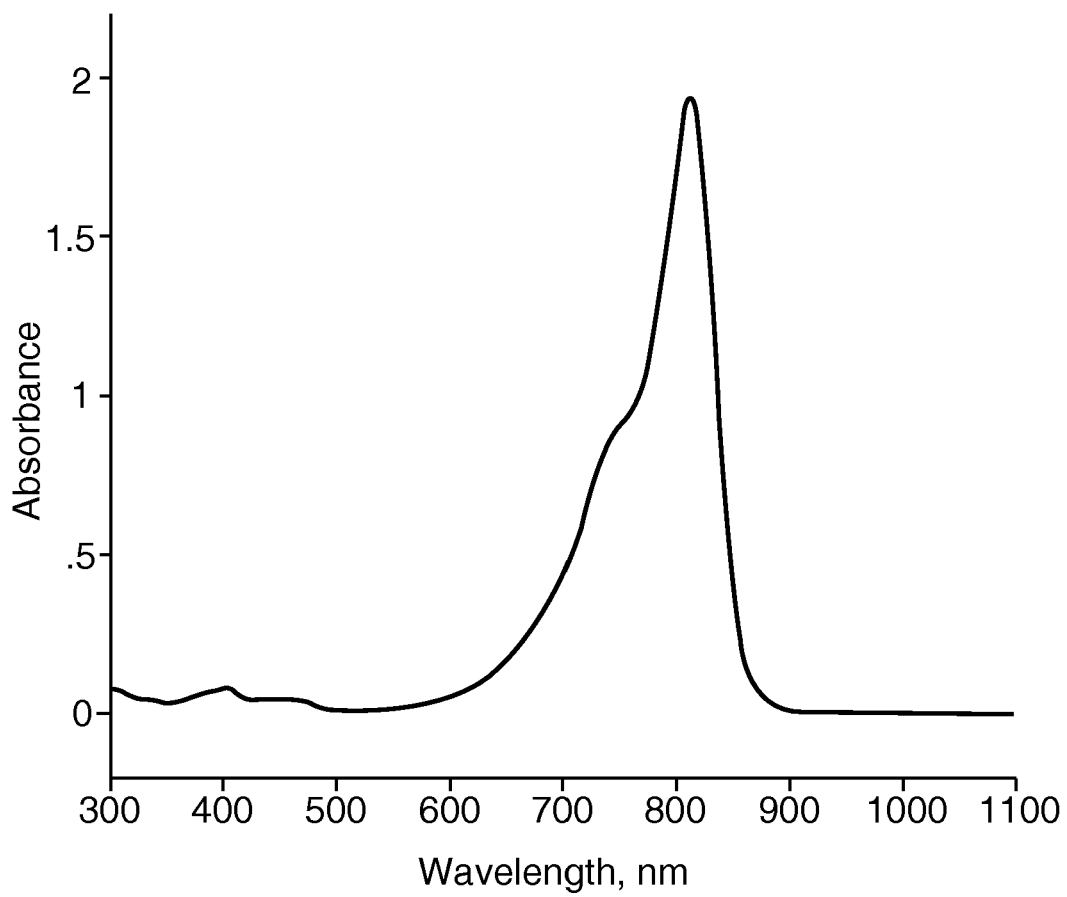
FIG. 2C is a graph illustrating a spectrum of YKR 2900 (Yamamoto) in an LTHC layer.

FIGS. 2A-2C are graphs illustrating spectra of exemplary materials for use in an LTHC layer. FIG. 2A is a graph illustrating a spectrum of Prussian Blue (Penn Color) in an LTHC layer. FIG. 2B is a graph illustrating a spectrum of Pro-Jet 830 LDI (Avecia) in an LTHC layer. FIG. 2C is a graph illustrating a spectrum of YKR 2900 (Yamamoto) in an LTHC layer.

Increased transparency in the visible spectral region (400 nm-700 nm) can be important for both visual and/or optical inspection and alignment. In addition, it may lower the heat load on the LTHC layer and substrate during the UV-cure process, thus reducing substrate deformation and possible degradation due to thermal effects.

LTHC layers containing preferred NIR-imaging radiation absorber materials in the LTHC layer transmit at least 20% or more of the incident power in the visible region from an ideal light source having a flat spectral energy distribution over that same range at an LTHC absorbance at the imaging wavelength of preferably 0.40 or greater, more preferably 0.7 or greater, and most preferably 1.0 or greater. LTHC layers containing more preferred NIR-imaging radiation absorber materials transmit at least 30% or more of the incident power in the visible region from an ideal light source having a flat spectral energy distribution over that same range at an LTHC absorbance at the imaging wavelength of preferably 0.40 or greater, more preferably 0.7 or greater, and most preferably 1.0 or greater. LTHC layers containing more preferred NIR-imaging radiation absorber materials transmit at least 40% or more of the incident power in the visible region from an ideal light source having a flat spectral energy distribution over that same range at an LTHC absorbance at the imaging wavelength of preferably 0.40 or greater, more preferably 0.7 or greater, and most preferably 1.0 or greater. LTHC layers containing more preferred NIR-imaging radiation absorber materials transmit at least 50% or more of the incident power in the visible region from an ideal light source having a flat spectral energy distribution over that same range at an LTHC absorbance at the imaging wavelength of preferably 0.40 or greater, more preferably 0.7 or greater, and most preferably 1.0 or greater.

In a similar fashion, the amount of UV energy (from approximately 200 nm-400 nm wavelength) transmitted through the LTHC coating relates to the ease with which the LTHC layer can be UV cured, ultimately affecting the level of residuals, cure speed, and potential for thermal distortion of the LTHC layer. The LTHC coatings made using the NIR-imaging radiation absorber materials present at a level sufficient to achieve an absorbance at the imaging wavelength of 0.2 to 3.0, in certain embodiments, do not show strong absorption through the accessible ultraviolet region (the polyester substrate effectively blocks all UV wavelengths below 300 nanometer) and transmit at least 15%, more preferably 20%, and more preferably 25% or more of the incident power in the ultraviolet region from an ideal radiation source having a flat spectral energy distribution over that same range. As a result, the coatings can be cured with less total UV energy at higher line speeds and/or a lower UV lamp power setting to provide a cured LTHC layer having lower residuals and less thermal distortion.

As indicated, a particulate imaging radiation absorber material may be disposed in a binder. The weight percent of the imaging radiation absorber material in the coating, excluding the solvent in the calculation of weight percent, is generally from 1 wt. % to 30 wt. %, more preferably from 3 wt. % to 20 wt. %, and more preferably from 5 wt. % to 15 wt. %, depending on the particular imaging radiation absorber material(s) and binder(s) used in the LTHC.

Optional polymeric binders may be included in the LTHC layer. Suitable polymeric binders for use in the LTHC layer include film-forming polymers, for example, phenolic resins (e.g., novolac, cresol and resole resins), polyvinyl butyral resins, polyvinyl acetates, polyvinyl acetals, polyvinylidene chlorides, polyacrylates, cellulosic ethers and esters, nitrocelluloses, polycarbonates, polyesters, polyurethanes, and urethane acrylates. Other suitable binders may include monomers, oligomers, or polymers that have been or can be polymerized or crosslinked. In some embodiments, the binder is primarily formed using a coating of polymerizable or crosslinkable monomers and/or oligomers with optional polymer. When a polymer is used in the binder, the binder includes 1 to 50 wt. %, preferably, 10 to 45 wt. %, polymer (excluding the solvent when calculating wt. %).

Upon coating on the donor substrate, the monomers, oligomers, and polymers are polymerized and/or crosslinked to form the LTHC layer. In some instances, if crosslinking of the LTHC layer is too low, the LTHC layer may be damaged by the heat and/or permit the transfer of a portion of the LTHC layer to the receptor with the transfer layer.

The inclusion of a thermoplastic resin (e.g., polymer) may improve, in at least some instances, the performance (e.g., transfer properties and/or coatability) of the LTHC layer. A thermoplastic resin may improve the adhesion of the LTHC layer to the donor substrate. In one embodiment, the binder includes 25 to 50 wt. % (excluding the solvent when calculating wt. %) thermoplastic resin, and preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. A solubility parameter can be used to indicate compatibility, as described in Polymer Handbook, J. Brandrup, ed., pp. VII 519-557 (1989), incorporated herein by reference. In at least some embodiments, a thermoplastic resin that has a solubility parameter in the range of 9 to 13 $(cal/cm^3)^{1/2}$, preferably 9.5 to 12 $(cal/cm^3)^{1/2}$, is chosen for the binder.

Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods. A polymeric or organic LTHC layer is coated, in at least some instances, to a thickness of about 0.05 micron to about 20 microns, more preferably of about 0.5 micron to about 10 microns, and more preferably of about 1 micron to about 7 microns. An inorganic LTHC layer is coated, in at least some instances, to a thickness in the range of 0.001 micron to 10 microns, and preferably 0.002 micron to 1 micron.

Radiation absorber material can be uniformly disposed throughout the LTHC layer or can be non-homogeneously distributed. For example, as described in U.S. Pat. No. 6,468,715, incorporated herein by reference, non-homogeneous LTHC layers can be used to control temperature profiles in donor elements. This can give rise to thermal transfer elements that have improved transfer properties (e.g., better fidelity between the intended transfer patterns and actual transfer patterns).

LTHC layers can have a non-homogeneous distribution of absorber material, for example, to control a maximum temperature attained in the donor element and/or to control a temperature attained at the transfer layer interface. For example, an LTHC layer can have absorber material distribution that is less dense closer to the donor substrate and more dense closer to the transfer layer. In many instances, such a design can cause more radiation to be absorbed and converted into heat deeper into the LTHC layer as compared to a homogeneous LTHC layer having the same thickness and optical density. For the sake of clarity, the term "depth" when used to describe a position in the LTHC layer means distance into the LTHC layer in the thickness dimension as measured from the donor substrate side of the thermal mass transfer element. In other instances, it may be beneficial to have an LTHC layer having an absorber material distribution that is more dense closer to the donor substrate and less dense closer to the transfer layer.

LTHC layers can also be formed by combining two or more LTHC layers containing similar or dissimilar materials. In this regard, where two more LTHC layers are used, only one layer need contain an imaging radiation absorber material that does not substantially increase radiation absorption at a curing wavelength. Other examples of LTHC constructions are discussed in more detail below.

The thermal mass transfer donor elements can include a non-homogeneous LTHC layer. For example, the LTHC layer can have a distribution of absorber material that varies with thickness. In particular, the LTHC layer can have an absorber density that increases with increasing depth. More generally, the LTHC layer can be designed to have a varying absorption coefficient by varying the distribution or density of the same absorber material throughout the LTHC layer, or by including different absorber materials or layers in different locations in the LTHC layer, or both. For the purposes of the present disclosure, the term non-homogeneous includes anisotropic thermal properties or distributions of material(s) in at least one direction in the LTHC layer.

In general, the absorption coefficient is proportional to the rate of absorption of imaging radiation in the LTHC layer. For a homogeneous LTHC layer, the absorption coefficient is constant through the thickness, and the optical density of the LTHC layer is approximately proportional to the total thickness of the LTHC layer multiplied by the absorption coefficient. For non-homogeneous LTHC layers, the absorption coefficient can vary. Exemplary non-homogeneous LTHC layers have an absorption coefficient that varies as a function of thickness of the LTHC layer, and the optical density will depend on the integral of the absorption coefficient taken over the entire LTHC thickness range.

A non-homogeneous LTHC layer can also have an absorption coefficient that varies in the plane of the layer. Additionally, absorber material can be oriented or non-uniformly dispersed in the plane of the LTHC layer to achieve an anisotropic thermal conductivity (e.g., acicular magnetic particles can be used as absorber particles and can be oriented in the presence of a magnetic field). In this manner, an LTHC layer can be made that conducts thermal energy efficiently through the thickness of the layer to transport heat to the transfer layer while having poor thermal conductivity in the plane of the layer so that less heat is dissipated into adjacent, cooler areas, for example those areas that have not been exposed to imaging radiation. Such an anisotropic thermal conductivity might be used to enhance the resolution of thermal patterning using donor elements of the present invention.

Likewise, any of the other layers of a thermal mass transfer donor element (e.g., substrate, underlayer, interlayer, and/or thermal transfer layer) can be made to have anisotropic thermal conductivities to control heat transport to or away from other layers. One way to make layers having anisotropic thermal conductivities is to have an anisotropic orientation or distribution of materials in the layer, the materials having different thermal conductivities. Another way is impart a surface of one or more layers with a physical structure (e.g., to make a layer thinner in some spots and thicker in others).

By designing LTHC layers to have an absorption coefficient that varies with layer thickness, imaging performance of the donor element can be enhanced. For example, the LTHC layer can be designed so that the maximum temperature attained in the donor element is lowered and/or the transfer temperature (i.e., temperature attained at the transfer layer/LTHC interface or transfer layer/interlayer interface) is raised, relative to a homogeneous LTHC layer that has the same thickness and optical density. Advantages can include the ability to use imaging conditions that can lead to improved transfer properties (e.g., transfer sensitivity) without damaging the donor element or transferred pattern due to overheating of the donor.

In exemplary embodiments, thermal mass transfer donor elements include an LTHC layer that has an absorption coefficient that varies with thickness. Such an LTHC layer can be made by any suitable technique. For example, two or more layers can be sequentially coated, laminated, or otherwise formed, each of the layers having a different absorption coefficient, thereby forming an overall non-homogeneous LTHC layer. The boundaries between the layers can be gradual (e.g., due to diffusion between the layers) or abrupt. Non-homogeneous LTHC layers can also be made by diffusing material into a previously formed layer to create an absorption coefficient that varies with thickness. Examples include diffusing an absorber material into a binder, diffusing oxygen into a thin aluminum layer, and the like.

Suitable methods for making non-homogeneous LTHC layers include, but are not limited to the following: sequentially coating two or more layers that have absorber material dispersed in a crosslinkable binder, each layer having a different absorption coefficient, and either crosslinking after each coating step or crosslinking multiple layers together after coating all the pertinent layers; sequentially vapor depositing two or more layers that have different absorption coefficients; and sequentially forming two or more layers that have different absorption coefficients, at least one of the layers including an absorber material disposed in a crosslinkable binder and at least one of the layers being vapor deposited, where the crosslinkable binder may be crosslinked immediately after coating that particular layer or after other coating steps are performed.

Examples of non-homogeneous LTHC layers that can be made include the following: a two-layer structure that has a higher absorption coefficient in a deeper region; a two-layer structure that has a lower absorption coefficient in a deeper region; a three-layer structure that has an absorption coefficient that becomes sequentially larger with depth; a three-layer structure that has an absorption coefficient that becomes sequentially smaller with depth; a three-layer structure that has an absorption coefficient that becomes larger and then smaller with increasing depth; a three-layer structure that has an absorption coefficient that becomes smaller and then larger with increasing depth; and so on depending on the desired number of layers. With increasing numbers of regions having different absorption coefficients, and/or with thinner regions, and/or with increased diffusion between regions, a non-homogeneous LTHC layer can be formed that approximates a continuously varying absorption coefficient.

In one embodiment, non-homogeneous LTHC layers that have an absorption coefficient that increases with depth can be used to lower a maximum temperature attained in the LTHC layer and to increase the donor element transfer temperature when the donor element is irradiated from the shallow side of the LTHC layer. An advantage to decreasing a maximum temperature in the donor element can be the reduction in defects caused by thermal decomposition or overheating of the LTHC layer or other layers. Such defects can include distortion of the transferred image, undesired transfer of portions of the LTHC layer to the receptor, unintended fragmentation of the transferred image, and increased surface roughness or other physical or chemical degradation of the transferred image (e.g., due to mechanical distortion of one or more layers due to overheating of the donor element during imaging). Such defects are referred to collectively as imaging defects. Another advantage to designing LTHC layers according to embodiments consistent with the present invention is that higher power radiation sources and/or longer dwell times (e.g., higher laser doses) can be used to raise the transfer temperature, thereby increasing the transfer fidelity while still not exceeding a temperature in the LTHC layer that might lead to imaging defects.

LTHC layers according to embodiments consistent with the present invention may exhibit higher visible light transmission characteristics than corresponding LTHC layers containing small particle absorber materials or other imaging radiation absorber materials which substantially absorb radiation at a curing wavelength or wavelengths. Some embodiments include a LITI donor film containing an LTHC layer that is at least partially transparent to visible light. This allows for easier visual or other on-line inspection of the LITI donor film for defects during the manufacturing process, for example. In some embodiments, a LITI donor film is provided that is at least partially transparent to visible light, thus permitting precise alignment of a pre-patterned donor film with a patterned receptor substrate and facilitating fabrication of complex multilayer electronic devices requiring precise positioning of patterned layers.

The LTHC layer can be used in a variety of thermal transfer elements, including thermal transfer elements that have a multi-component transfer assembly and thermal transfer elements that are used to transfer a single layer of a device or other item. The LTHC layer can be used with thermal transfer elements that are useful in forming multilayer devices, as described above, as well as thermal transfer elements that are useful for forming other items. Examples include such items as color filters, spacer layers, black matrix layers, printed circuit boards, displays (e.g., liquid crystal and emissive displays), polarizers, z-axis conductors, and other items that can be formed by thermal transfer including, for example, those described in U.S. Pat. Nos. 5,156,938; 5,171,650; 5,244,770; 5,256,506; 5,387,496; 5,501,938; 5,521,035; 5,593,808; 5,605,780; 5,612,165; 5,622,795; 5,685,939; 5,691,114; 5,693,446; and 5,710,097; and PCT Patent Applications Nos. 98/03346 and 97/15173.

Optional Interlayer

An interlayer may be included as an optional element in the thermal transfer element. The optional interlayer may be used to minimize damage and contamination of the transferred portion of the transfer layer and may also reduce distortion in the transferred portion of the transfer layer. The interlayer may also influence the adhesion of the transfer layer to the thermal transfer element or otherwise control the release of the transfer layer in the imaged and non-imaged regions. Typically, the interlayer has high thermal resistance and does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g, silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (e.g., solvent coating or spray coating). Typically, the glass transition temperature ($T_g$) of thermoplastic materials suitable for use in the interlayer is 25° C. or greater, more preferably 50° C. or greater, more preferably 100° C. or greater, and more preferably 150° C. or greater. The interlayer may be optically transmissive, optically absorbing, optically reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the LTHC layer. It may also modulate the temperature attained in the transfer layer so that thermally unstable and/or temperature sensitive materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory or decreased distortion in the transferred material.

The interlayer may contain additives, including, for example, photoinitiators, surfactants, pigments, plasticizers, and coating aids. The thickness of the interlayer may depend on factors such as, for example, the material of the interlayer, the material of the LTHC layer, the material of the transfer layer, the wavelength of the imaging radiation, and the duration of exposure of the thermal transfer element to imaging radiation. For polymer interlayers, the thickness of the interlayer typically is in the range of about 0.05 micron to about 10 microns, more preferably from about 0.1 micron to about 4 microns, more preferably from about 0.5 micron to about 3 microns, and more preferably from about 0.8 micron to about 2 microns. For inorganic interlayers (e.g., metal or metal compound interlayers), the thickness of the interlayer typically is in the range of about 0.005 micron to about 10 microns, more preferably, from about 0.01 micron to about 3 microns, and more preferably from about 0.02 micron to about 1 micron.

Transfer Layer

A transfer layer may be included in the thermal transfer element. A transfer layer is generally formed overlaying the LTHC layer, for example, by evaporation or sputtering, by coating as a uniform layer, or by printing in a pattern using digital printing (e.g., digital inkjet or digital electrophotographic printing), lithographic printing or evaporation or sputtering though a mask. As noted previously, other optional layers, for example, an optional interlayer, may be interposed between the LTHC layer and the transfer layer.

A transfer layer typically includes one or more layers for transfer to a receptor. These layers may be formed using organic, inorganic, organometallic, and other materials, including, for example, an electroluminescent material or electronically active material. Although the transfer layer is described and illustrated as having discrete layers, it will be appreciated that, at least in some instances, there may be an interfacial region that includes at least a portion of each layer. This may occur, for example, if there is mixing of the layers or diffusion of material between the layers before, during, or after transfer of the transfer layer. In other instances, two layers may be completely or partially mixed before, during, or after transfer of the transfer layer.

One example of a transfer layer includes a multi-component transfer assembly that is used to form a multilayer device, such as an active or passive device, on a receptor. In some cases, the transfer layer may include all of the layers needed for the active or passive device. In other instances, one or more layers of the active or passive device may be provided on the receptor, the remaining layers being included in the transfer layer. Alternatively, one or more layers of the active or passive device may be transferred onto the receptor after the transfer layer has been deposited. In some instances, the transfer layer is used to form only a single layer of the active or passive device or a single or multiple layer of an item other than a device. One advantage of using a multi-component transfer assembly, particularly if the layers do not mix, is that the important interfacial characteristics of the layers in the multi-component transfer assembly can be produced when the thermal transfer assembly is prepared and, preferably, retained during transfer. Individual transfer of layers may result in less optimal interfaces between layers.

The thermal transfer element can include a transfer layer that can be used to form, for example, electronic circuitry, resistors, capacitors, diodes, rectifiers, electroluminescent lamps, memory elements, field effect transistors, bipolar transistors, unijunction transistors, metal oxide semiconductor (MOS) transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof, for example, the combination of field effect transistors and organic electroluminescent lamps as an active matrix array for an optical display. Other items may be formed by transferring a multi-component transfer assembly and/or a single layer.

Examples of transfer layers that can be selectively patterned from thermal mass transfer donor elements include transfer layers which include colorants (e.g., pigments and/or dyes dispersed or dissolved in a binder), polarizers, liquid crystal materials, particles (e.g., spacers for liquid crystal displays, magnetic particles, insulating particles, conductive particles), emissive materials (e.g., phosphors and/or organic electroluminescent materials), hydrophobic materials (e.g., partition banks for ink jet receptors), hydrophilic materials, multilayer stacks (e.g., multilayer device constructions such as organic electroluminescent devices), microstructured or nanostructured layers, photoresist, metals, polymer containing layers, adhesives, binders, enzymes or other bio-materials, or other suitable materials or combination of materials. Examples of transfer layers are disclosed in the following documents: U.S. Pat. Nos. 5,725,989; 5,710,097; 5,693,446; 5,691,098; 5,685,939; and 5,521,035; International Publication Nos. WO 97/15173, WO 98/03346, and WO 99/46961; and co-assigned U.S. patent application Ser. Nos. 09/231,724; 09/312,504; 09/312,421; and 09/392,386.

Particularly well-suited transfer layers include materials that are useful in optical devices suitable for display applications. Thermal mass transfer can be performed to pattern one or more materials on a receptor with high precision and accuracy using fewer processing steps than for photolithography-based patterning techniques and thus can be especially useful in applications such as display manufacture. For example, transfer layers can be made so that, upon thermal transfer to a receptor, the transferred materials form color filters, black matrix, spacers, barriers, partitions, polarizers, retardation layers, wave plates, organic conductors or semi-conductors, inorganic conductors or semi-conductors, organic electroluminescent layers (fluorescent and/or phosphorescent), phosphor layers, organic electroluminescent devices, organic transistors, and other such elements, devices, or portions thereof that can be useful in displays, alone or in combination with other elements that may or may not be patterned in a like manner.

In some embodiments, the transfer layer is pre-patterned on the donor element and all, or part, of the pre-patterned transfer layer is transferred to the receptor via the radiation induced imaging process. Various layers (e.g., an adhesion layer) may be coated onto the transfer layer to facilitate transfer of the transfer layer to the substrate.

LITI Patterning

For thermal transfer using radiation (e.g., light), a variety of radiation-emitting sources can be used. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power (e.g., $\geq 100$ mW) single mode laser diodes, fiber-coupled laser diodes, and diode-pumped solid state lasers (e.g., Nd:YAG and Nd:YLF). Laser exposure dwell times can be in the range from, for example, about 0.1 microsecond to 100 microseconds and laser fluences can be in the range from, for example, about 0.01 $J/cm^2$ to about 1 $J/cm^2$.

When high spot placement accuracy is required (e.g., for high information full color display applications) over large substrate areas, a laser is particularly useful as the radiation source. Laser sources are compatible with both large rigid substrates such as 1 meter (m)×1 m×1.1 mm glass, and continuous or sheeted film substrates, such as 100 microns thick polyimide sheets.

Thermal Transfer to a Receptor

During imaging, the thermal transfer element is typically brought into intimate contact with a receptor for imaging and transfer of a portion of the transfer layer to the receptor. In at least some instances, pressure or vacuum may be used to hold the thermal transfer element in intimate contact with the receptor. A radiation source may then be used to heat the LTHC layer (and/or other layer(s) containing imaging radiation absorber material) in an image-wise fashion (e.g., digitally or by analog exposure through a mask) to perform image-wise transfer of the transfer layer from the thermal transfer element to the receptor according to a pattern in order to form, for example, an organic microelectronic device.

Typically, the transfer layer is transferred to the receptor without transferring any of the other layers of the thermal transfer element, such as the optional interlayer and the LTHC layer. Preferably, the adhesive and cohesive forces in the donor and receptor coatings are configured such that the transfer layer is transferred in the radiation exposed regions and is not transferred in the non-exposed regions. In some instances, a reflective interlayer can be used to attenuate the level of imaging radiation transmitted through the interlayer and reduce any damage to the transferred portion of the transfer layer that may result from interaction of the transmitted radiation with the transfer layer and/or the receptor. This effect is particularly beneficial in reducing thermal damage that may occur when the receptor is highly absorptive of the imaging radiation.

During laser exposure, it may be desirable to minimize formation of interference patterns due to multiple reflections from the imaged material, which can be accomplished by various methods. The most common method is to effectively roughen the surface of the thermal transfer element on the scale of the incident radiation as described in U.S. Pat. No. 5,089,372. This roughening has the effect of disrupting the spatial coherence of the incident radiation, thus minimizing self interference. An alternate method is to employ an antireflection coating within the thermal transfer element on either, or both, sides of the substrate. The use of anti-reflection coatings is known and may be implemented with quarter-wave thicknesses of a coating such as magnesium fluoride, as described in U.S. Pat. No. 5,171,650, which is incorporated herein by reference.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element moved beneath the laser.

In some instances, it may be necessary, desirable, and/or convenient to sequentially use two or more different thermal transfer elements to form a device. For example, one thermal transfer element may be used to form a gate electrode of a field effect transistor and another thermal transfer element may be used to form the gate insulating layer and semiconducting layer, and yet another thermal transfer layer may be used to form the source and drain contacts. A variety of other combinations of two or more thermal transfer elements can be used to form a device, each thermal transfer element forming one or more layers of the device. Each of these thermal transfer elements may include a multi-component transfer assembly or may only include a single layer for transfer to the receptor. The two or more thermal transfer assemblies are then sequentially used to deposit one or more layers of the device. In some instances, at least one of the two or more thermal transfer elements includes a multi-component transfer assembly.

Receptors

The receptor substrate may be any item suitable for a particular application including, but not limited to, glass, transparent films, reflective films, metals, semiconductors, various papers, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of rigid receptor substrates include glass, indium tin oxide coated glass, low temperature polysilicon (LTPS), and rigid plastic.

Suitable flexible substrates include substantially clear and transmissive polymer films, reflective films, non-birefringent films, transflective films, polarizing films, multilayer optical films, and the like. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports in various imaging arts. Transparent polymeric film base of 2 mils to 100 mils (i.e., 0.05 mm to 2.54 mm) is preferred.

For glass receptor substrates, a typical thickness is 0.2 mm to 2.0 mm. It is often desirable to use glass substrates that are 1.0 mm thick or less, or even 0.7 mm thick or less. Thinner substrates result in thinner and lighter weight displays. However, certain processing, handling, and assembling conditions may require thicker substrates. For example, some assembly conditions may require compression of the display assembly to fix the positions of spacers disposed between the substrates. The competing concerns of thin substrates for lighter displays and thick substrates for reliable handling and processing can be balanced to achieve a preferred construction for particular display dimensions.

If the receptor substrate is a polymeric film, it may be preferred that the film be non-birefringent to substantially prevent interference with the operation of the display in which it is to be integrated, or it may be preferred that the film be birefringent to achieve desired optical effects. Exemplary non-birefringent receptor substrates are polyesters that are solvent cast. Typical examples of these are those derived from polymers consisting or consisting essentially of repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. Another class of non-birefringent substrates are amorphous polyolefins (e.g., those sold under the trade designation Zeonex™ from Nippon Zeon Co., Ltd.). Exemplary birefringent polymeric receptors include multilayer polarizers or mirrors such as those disclosed in U.S. Pat. Nos. 5,882,774 and 5,828,488, and in International Publication No. WO 95/17303.

Various layers (e.g., an adhesive layer) may be coated onto the final receptor substrate to facilitate transfer of the transfer layer to the receptor substrate. Other layers may be coated on the final receptor substrate to form a portion of a multilayer device. For example, an organic light emitting diode (OLED) or other electronic device may be formed using a receptor substrate having a metal anode or cathode formed on the receptor substrate prior to transfer of the transfer layer from the thermal transfer element. This metal anode or cathode may be formed, for example, by deposition of a conductive layer on the receptor substrate and patterning of the layer into one or more anodes or cathodes using, for example, photolithographic techniques.

Microelectronic Device Fabrication with LITI Donors

A variety of electronic and optical devices can be fabricated using radiation curable LITI donor films. In some instances, multiple thermal transfer elements may be used to form a device or other object. The multiple thermal transfer elements may include thermal transfer elements with multi-component transfer assemblies and thermal transfer elements that transfer a single layer. For example, a device or other object may be formed using one or more thermal transfer elements with multi-component transfer assemblies and one or more thermal transfer elements that transfer a single layer.

The multilayer device formed using the multi-component transfer assembly of the transfer layer may be, for example, an electronic or optical device. Examples of such devices include electronic circuitry, resistors, capacitors, diodes, rectifiers, electroluminescent lamps, electroluminescing devices, memory elements, field effect transistors, bipolar transistors, unijunction transistors, MOS transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof. Other electrically conductive devices that can be formed include, for example, electrodes and conductive elements.

Some embodiments consistent with the present invention provide a transfer layer that includes a multi-component transfer assembly used to form at least a portion of a passive or active device. As an example, in one embodiment the transfer layer includes a multi-component transfer assembly that is capable of forming at least two layers of a multilayer device. These two layers of the multilayer device often correspond to two layers of the transfer layer. In this example, one of the layers that is formed by transfer of the multi-component transfer assembly is an active layer (i.e., a layer that acts as a conducting, semi-conducting, superconducting, waveguiding, frequency multiplying, light producing (e.g., luminescing, light emitting, fluorescing, or phosphorescing), electron producing, or hole producing layer in the device and/or as a layer that produces an optical or electronic gain in the device.)

A second layer that is formed by transfer of the multi-component transfer assembly is another active layer or an operational layer (i.e., a layer that acts as an insulating, conducting, semiconducting, superconducting, waveguiding, frequency multiplying, light producing (e.g., fluorescing or phosphorescing), electron producing, hole producing, light absorbing, reflecting, diffracting, phase retarding, scattering, dispersing, or diffusing layer in the device and/or as a layer that produces an optical or electronic gain in the device). The multi-component transfer assembly may also be used to form additional active layers and/or operational layers, as well as, non-operational layers (i.e., layers that do not perform a function in the operation of the device but are provided, for example, to facilitate transfer of a transfer assembly to a receptor substrate and/or adhere the transfer assembly to the receptor substrate).

The transfer layer may include an adhesive layer disposed on an outer surface of the transfer layer to facilitate adhesion to the receptor. The adhesive layer may be an operational layer, for example if the adhesive layer conducts electricity between the receptor and the other layers of the transfer layer, or a non-operational layer, for example if the adhesive layer only adheres the transfer layer to the receptor. The adhesive layer may be formed using, for example, thermoplastic polymers, including conducting and non-conducting polymers, conducting and non-conducting filled polymers, and/or conducting and non-conducting dispersions. Examples of suitable polymers include acrylic polymers, polyanilines, polythiophenes, poly(phenylenevinylenes), polyacetylenes, and other conductive organic materials such as those listed in Handbook of Conductive Molecules and Polymers, Vols. 1-4, H. S. Nalwa, ed., John Wiley and Sons, Chichester (1997), incorporated herein by reference. Examples of suitable conductive dispersions include inks containing carbon black, graphite, ultrafine particulate indium tin oxide, ultrafine antimony tin oxide, and commercially available materials from companies such as Nanophase Technologies Corporation (Burr Ridge, Ill.) and Metech (Elverson, Pa.).

The transfer layer may also include an optional release layer disposed on the surface of the transfer layer that is in contact with the rest of the thermal transfer element, This release layer may partially or completely transfer with the remainder of the transfer layer or substantially all of the release layer may remain with the thermal transfer element upon transfer of the transfer layer.

Although the transfer layer may be formed with discrete layers, it will be understood that, in at least some embodiments, the transfer layer may include layers that have multiple components and/or multiple uses in the device. It will also be understood that, at least in some embodiments, two or more discrete layers may be melted together during transfer or otherwise mixed or combined.

OLED Fabrication

The transfer of a multi-component transfer assembly to form at least a portion of an OLED provides an illustrative, non-limiting example of the formation of an active device using a thermal transfer element. An example of a multicomponent transfer unit is described in U.S. Pat. No. 6,410,201, which is incorporated herein by reference. In at least some instances, an OLED device includes a thin layer or layers of suitable organic materials sandwiched between a cathode and an anode. Electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. These excitons, or excited state species, may emit energy in the form of light as they decay back to a ground state (see, e.g., T. Tsutsui, MRS Bulletin, 22, 39-45 (1997), incorporated herein by reference).

Illustrative OLED constructions are known to those skilled in the art (see, e.g., Organic Electroluminescence, Zakya Kafafi (ed.), CRC Press, NY, 2005). Illustrative examples of OLED constructions include molecularly dispersed polymer devices where charge carrying and/or emitting species are dispersed in a polymer matrix (see J. Kido "Organic Electroluminescent devices Based on Polymeric Materials", Trends in Polymer Science, 2, 350-355 (1994), incorporated herein by reference), conjugated polymer devices where layers of polymers such as polyphenylene vinylene act as the charge carrying and emitting species (see J. J. M. Halls et al., Thin Solid Films, 276, 13-20 (1996), incorporated herein by reference), vapor deposited small molecule heterostructure devices (see U.S. Pat. No. 5,061,569 and C. H. Chen et al., "Recent Developments in Molecular Organic Electroluminescent Materials", Macromolecular Symposia, 125, 1-48 (1997), incorporated herein by reference), light emitting electrochemical cells (see Q. Pei et al., J. Amer. Chem. Soc., 118, 3922-3929 (1996), incorporated herein by reference), and vertically stacked organic light-emitting diodes capable of emitting light of multiple wavelengths (see U.S. Pat. No. 5,707,745 and Z. Shen et al., Science, 276, 2009-2011 (1997), incorporated herein by reference). The emission of light of different colors may be achieved by the use of different emitters and dopants in the electron transport/emitter layer 206 (see C. H. Chen et al., "Recent Developments in Molecular Organic Electroluminescent Materials", Macromolecular Symposia, 125, 1-48 (1997), incorporated herein by reference).

Other OLED multilayer device constructions may be transferred using different transfer layers. Furthermore, a separate emitter layer could be interposed between layers. The multilayer assembly can be transferred onto a receptor to form OLEDs. For example, green OLEDs can be transferred onto the receptor substrate. Subsequently, blue OLEDs and then red OLEDs may be transferred. Each of the green, blue, and red OLEDs are transferred separately using green, blue, and red thermal transfer elements, respectively, to form display sub-pixels. Alternatively, the red, green, and blue thermal transfer elements can be transferred on top of one another to create a multi-color stacked OLED device of the type disclosed in U.S. Pat. No. 5,707,745, incorporated herein by reference.

Another method for forming a full color device includes depositing columns of hole transport layer material and then sequentially depositing red, green, and blue electron transport layer/emitter multi-component transfer assemblies either parallel or perpendicular to the hole transport material. Yet another method for forming a full color device includes depositing red, green, and blue color filters (either conventional transmissive filters, fluorescent filters, or phosphors) and then depositing multi-component transfer assemblies corresponding to white light or blue light emitters.

After formation, the OLED is typically coupled to a driver and sealed to prevent damage. The thermal transfer element can be a small or a relatively large sheet coated with the appropriate transfer layer. The use of laser light or other similar light-emitting sources for transferring these devices permits the formation of narrow lines and other shapes from the thermal transfer element. A laser or other light source could be used to produce a pattern of the transfer layer on the receptor, including receptors that may be meters in length and width.

The following examples illustrate radiation curable LITI donor films and the use of radiation cured thermal transfer elements according to some embodiments consistent with the present invention. One skilled in the art may appreciate some of the advantages of using radiation curable thermal transfer elements according to these embodiments. For example, the number of processing steps may be reduced as compared to conventional photolithography methods because many of the layers of each OLED are transferred simultaneously, rather than using multiple etching and masking steps. Moreover, the time required to produce patterned LITI transfer elements may be reduced. In addition, multiple devices and patterns can be created using the same imaging hardware with different thermal elements.

EXAMPLES

| Term | Meaning |
| --- | --- |
| BAlQ | Bis-(2-methyl-8-quinolato)-4-(phenyl-phenalato)-Aluminum, available from H. W. Sands Corp, Jupiter, FL |
| AlQ | Tris(8-hydroxyquinoline) aluminum available from H. W. Sands Corp, Jupiter, FL |
| LiF | Lithium fluoride, 99.85%, available from Alfa Aesar, Ward Hill, MA as product number 36359 |
| Al | Puratronic aluminum shots, 99.999%, available from Alfa Aesar, Ward Hill, MA |
| Ag | Silver (target available from Arconium, Providence RI) |
| ITO | Indium tin oxide |
| OEL | Organic electroluminescent |
| OLED | Organic light-emitting diode |
| LCD | Liquid Crystal Display |
| RPM | Revolutions per minute |
| Irgacure 184 | 1-hydroxycyclohexyl phenyl ketone available from Ciba Specialty Chemicals Corporation, Tarrytown, NY, as Irgacure 184 |
| PET | Polyethylene terephthalate |
| PEDOT VP CH 8000 | A mixture of water and 3,4-polyethylenedioxythiophene-polystyrenesulfonate (cationic) available from H. C. Starck, Newton, MA |
| Irgacure 369 | 2-benzyl-2-(dimethylamino)-1-(4-(morpholinyl)phenyl) butanone, available from Ciba Specialty Chemicals Corporation, Tarrytown, NY |
| MEK | Methyl Ethyl Ketone |
| PMA | 1-methoxy-2-propanol acetate |
| PM | 1-methoxy-2-propanol |
| UV | Ultraviolet |
| nm | Nanometer |
| kW | Kilowatt |
| μ | Micrometer/micron |
| AFM | Atomic Force Microscopy |
| TMPTA | Trimethylolpropane triacrylate ester, available from Sartomer, Exton, PA as SR351 |
| LITI | Laser-induced thermal imaging |
| LTHC | Light-to-heat conversion |
| IL | Interlayer |
| Wt. % | Weight percent |
| HTM-001 | Hole transport material from Covion Organic Semiconductors, GmbH, Frankfurt, Germany |
| TMM-004 | Triplet Matrix Host Material from Covion Organic Semiconductors, GmbH, Frankfurt, Germany |
| M7Q | PET film, 2.88 mil thickness available from DuPont Teijin Films, Hopewell, VA |
| OD | Optical Density |
| Esacure ONE | difunctional alpha-hydroxyketone photoinitiator available from Lamberti, Conshohocken, PA. |
| TPO | acylphosphine oxide photoinitiator available from BASF, Charlotte, NC as Lucirin TPO |

Example 1

LTHC layers having similar absorptions at 808 nanometers were prepared containing carbon black and Prussian Blue (also known as Iron Blue and Pigment Blue 27).

Run 1 was prepared in the following manner. Before application of the LTHC solution, the inside of the base film substrate, M7Q, 2.88 mil thick polyethylene terephthalate (DuPont Teijin Films, Hopewell Va.), was corona treated using nitrogen at a linespeed of 50 feet per minute and a power of 300 Watts. A Prussian Blue based LTHC solution (non-small particle absorber) having the composition shown in Table I was then applied onto the corona treated M7Q film using a reverse microgravure coating method (Yasui Seiki Lab Coater, Model CAG-150). In order to achieve a dry thickness of approximately 2.8 microns, a line speed of 20 feet/minute was used and a microgravure of 180 R set at 9.0 feet per minute. The coating was dried in-line through a series of three ovens (75/75/80° C.) and photocured under ultraviolet (UV) radiation from a Fusion UV Systems (Gaithersburg, Md.) 600 W/in. lamp with a D bulb at a power setting of 70%. The cured coating had an optical density of approximately 2.7 at 670 nm.

Run 2 was prepared in the following manner. Interlayer solution I was applied onto the cured LTHC layer, Run 1, using a reverse microgravure coating method (Yasui Seiki Lab Coater, Model CAG-150). In order to achieve a dry thickness of approximately 2.6 microns, a line speed of 20 feet/minute was used and a microgravure of 180 R set at 8.0 feet per minute. The coating was dried in-line through a series of three ovens (40/50/50° C.) and photocured under ultraviolet (UV) radiation using from Fusion UV Systems 600 W/in. lamp with an H+ bulb at a power setting of 70%.

Run 3 was prepared in the following manner. Before application of the LTHC solution, the inside of the base film substrate, M7Q, 2.88 mil thick polyethylene terapthalate (DuPont Teijin Films, Hopewell Va.), was corona treated using nitrogen at a linespeed of 50 feet per minute and a power of 300 Watts. A carbon black based LTHC solution prepared using 9B950D (small particle absorber) having the composition shown in Table I was then applied onto the corona treated M7Q film. The LTHC solution was applied using a reverse microgravure coating method (Yasui Seiki Lab Coater, Model CAG-150). In order to achieve a dry thickness of approximately 2.8 microns, a line speed of 20 feet/minute was used and a microgravure of 180 R set at 32.1 feet per minute. The coating was dried in-line through a series of three ovens (75/75/80° C.) and photocured under ultraviolet (UV) radiation from a Fusion UV Systems 600 W/in. lamp with a D bulb at a power setting of 70%. The cured coating had an optical density of approximately 2.6 at 670 nm.

Run 4 was prepared in the following manner. Interlayer solution I was applied onto the cured LTHC layer, Run 3, using a reverse microgravure coating method (Yasui Seiki Lab Coater, Model CAG-150). In order to achieve a dry thickness of approximately 1.4 microns, a line speed of 20 feet/minute was used and a microgravure of 200R set at 6.5 feet per minute. The coating was dried in-line through a series of three ovens (40/50/50° C.) and photocured under ultraviolet (UV) radiation from a Fusion UV Systems 600 W/in. lamp with an H+ bulb at a power setting of 70%.

Compositions of the two LTHC layer formulations are listed in Table I and the dried films in Table II. Comparative property data for the LTHC layer coatings are presented in Table III. Extractable unreacted TMPTA was determined using HPLC. Extracted unreacted total acrylates were calculated from the measured TMPTA divided by the estimated percentage of TMPTA in the TMPTA monomer reported by Sartomer. The extractables data show how the increased UV transmission of the Prussian Blue LTHC layer (Run 1) and Prussian Blue LTHC layer with interlayer (Run 2) leads to a better cure of the coating chemistry, dramatically reducing the amount of extractable TMPTA monomer compared to the carbon black LTHC layer (Run 3) and Carbon Black LTHC layer with interlayer (Run 4).

Surface roughness data from a Prussian Blue and a carbon black loaded LTHC layer and donor film were determined using tapping mode atomic force microscopy (AFM) and Surface Interferometry. Tapping mode AFM area profiling on a 5 micron by 5 micron area was conducted using a Digital Instruments Dimension 5000 SPM instrument. The root mean square (Rq) surface roughness was determined over the area with a resolution of 512 by 512 pixels. Surface Interferometry was conducted using a Wyko NT3300 optical profiler operating in VSI mode. The root mean square (Rq) surface roughness was determined on a size scale of 603 microns by 459 microns. Root mean square values are reported in Table III for Runs 1, 2, 3 and 4.

The increased surface roughness of the carbon black loaded LTHC layer relative to the LTHC layer containing Prussian Blue as an imaging radiation absorber material is readily apparent. In addition, the surface roughness of the Prussian Blue LTHC layer is almost identical with the interlayer coating as it is without the interlayer coating, in contrast to the performance of the carbon black loaded LTHC layer, which exhibits high surface roughness before the interlayer is coated. Both lower extractables and lower surface roughness can be advantageous to improving thermal transfer efficiency and transferred image quality.

Example 2

A series of LTHC layer coatings at different pigment loading levels were prepared from the compositions shown in Table IV.

Run 5 was prepared in the following manner. Before application of the LTHC solution, the inside of the base film substrate, M7Q, 2.88 mil thick polyethylene terapthalate (DuPont Teijin Films, Hopewell Va.), was corona treated using nitrogen at a linespeed of 50 feet per minute and a power of 300 Watts. A Prussian Blue based LTHC solution using 9S928D (non-small particle absorber) having the composition shown in Table IV was then applied onto the corona treated M7Q film. The LTHC solution was applied using a reverse microgravure coating method (Yasui Seiki Lab Coater, Model CAG-150). In order to achieve a dry thickness of approximately 1.25 microns, a line speed of 20 feet/minute was used and a microgravure of 200R set at 6.2 feet per minute. The coating was dried in-line through a series of three ovens (75/75/80° C.) and photocured under ultraviolet (UV) radiation from a Fusion UV Systems 600 W/in. lamp with a D bulb at a power setting of 70%. The cured coating had an optical density of approximately 0.682 at 670 nm.

Interlayer solution II was then applied onto the cured LTHC layer using a reverse microgravure coating method (Yasui Seiki Lab Coater, Model CAG-150). In order to achieve a dry thickness of approximately 1.16 microns, a line speed of 20 feet/minute was used and a microgravure of 200R set at 10.2 feet per minute. The coating was dried in-line through a series of three ovens (40/50/50° C.) and photocured under ultraviolet (UV) radiation from a Fusion UV Systems 600 W/in. lamp with an H+ bulb at a power setting of 70%.

Run 6 was prepared in the following manner. Before application of the LTHC solution, the inside of the base film substrate, M7Q, 2.88 mil thick polyethylene terapthalate (DuPont Teijin Films, Hopewell Va.), was corona treated using nitrogen at a linespeed of 50 feet per minute and a power of 300 Watts. A Prussian Blue based LTHC solution using 9S928D (non-small particle absorber) having the composition shown in Table IV was then applied onto the corona treated M7Q film. The LTHC solution was applied using a reverse microgravure coating method (Yasui Seiki Lab Coater, Model CAG-150). In order to achieve a dry thickness of approximately 2.75 microns, a line speed of 20 feet/minute was used and a microgravure of 180 R set at 8.6 feet per minute. The coating was dried in-line through a series of three ovens (75/75/80° C.) and photocured under ultraviolet (UV) radiation from a Fusion UV Systems 600 W/in. lamp with a D bulb at a power setting of 70%. The cured coating had an optical density of approximately 1.43 at 670 nm.

Interlayer solution II was then applied onto the cured LTHC layer using a reverse microgravure coating method (Yasui Seiki Lab Coater, Model CAG-150). In order to achieve a dry thickness of approximately 1.18 microns, a line speed of 20 feet/minute was used and a microgravure of 200R set at 10.2 feet per minute. The coating was dried in-line through a series of three ovens (40/50/50° C.) and photocured under ultraviolet (UV) radiation from a Fusion UV Systems 600 W/in. lamp with an H+ bulb at a power setting of 70%.

Run 7 was prepared in the following manner. Before application of the LTHC solution, the inside of the base film substrate, M7Q, 2.88 mil thick polyethylene terapthalate (DuPont Teijin Films, Hopewell Va.), was corona treated using nitrogen at a linespeed of 50 feet per minute and a power of 300 Watts. A Prussian Blue based LTHC solution using 9S928D (non-small particle absorber) having the composition shown in Table IV was then applied onto the corona treated M7Q film. The LTHC solution was applied using a reverse microgravure coating method (Yasui Seiki Lab Coater, Model CAG-150). In order to achieve a dry thickness of approximately 2.75 microns, a line speed of 20 feet/minute was used and a microgravure of 180 R set at 7.9 feet per minute. The coating was dried in-line through a series of three ovens (75/75/80° C.) and photocured under ultraviolet (UV) radiation from a Fusion UV Systems 600 W/in. lamp with a D bulb at a power setting of 70%. The cured coating had an optical density of approximately 3.127 at 670 nm.

Interlayer solution II was then applied onto the cured LTHC layer using a reverse microgravure coating method (Yasui Seiki Lab Coater, Model CAG-150). In order to achieve a dry thickness of approximately 1.16 microns, a line speed of 20 feet/minute was used and a microgravure of 200R set at 10.2 feet per minute. The coating was dried in-line through a series of three ovens (40/50/50° C.) and photocured under ultraviolet (UV) radiation from a Fusion UV Systems 600 W/in. lamp with an H+ bulb at a power setting of 70%.

Run 8 (comparative) was prepared in the following manner. Before application of the LTHC solution, the inside of the base film substrate, M7Q, 2.88 mil thick polyethylene terapthalate (DuPont Teijin Films, Hopewell Va.), was corona treated using nitrogen at a linespeed of 50 feet per minute and a power of 300 Watts. A carbon black based LTHC solution using 9B950D (small particle absorber) having the composition shown in Table IV was then applied onto the corona treated M7Q film. The LTHC solution was applied using a reverse microgravure coating method (Yasui Seiki Lab Coater, Model CAG-150). In order to achieve a dry thickness of approximately 1.25 microns, a line speed of 20 feet/minute was used and a microgravure of 180 R set at 5.0 feet per minute. The coating was dried in-line through a series of three ovens (75/75/80° C.) and photocured under ultraviolet (UV) radiation from a Fusion UV Systems 600 W/in. lamp with a D bulb at a power setting of 70%. The cured coating had an optical density of approximately 0.46 at 670 nm.

Run 9 (comparative) was prepared in the following manner. Before application of the LTHC solution, the inside of the base film substrate, M7Q, 2.88 mil thick polyethylene terapthalate (DuPont Teijin Films, Hopewell Va.), was corona treated using nitrogen at a linespeed of 50 feet per minute and a power of 300 Watts. A carbon black based LTHC solution using 9B950D (small particle absorber) having the composition shown in Table IV was then applied onto the corona treated M7Q film. The LTHC solution was applied using a reverse microgravure coating method (Yasui Seiki Lab Coater, Model CAG-150). In order to achieve a dry thickness of approximately 1.25 microns, a line speed of 20 feet/minute was used and a microgravure of 200R set at 5.4 feet per minute. The coating was dried in-line through a series of three ovens (75/75/80° C.) and photocured under ultraviolet (UV) radiation from a Fusion UV Systems 600 W/in. lamp with a D bulb at a power setting of 70%. The cured coating had an optical density of approximately 0.95 at 670 nm.

The corresponding weight percentages in the cured films are listed in Table V. Table VI provides a comparison of the integrated visible and ultraviolet light transmission characteristics for the coatings of Table V, containing representative NIR-imaging radiation absorber materials at various loadings, and two carbon black comparatives with a high and low weight loading. Even at optical densities as high as 1.49 at the imaging laser wavelength, where 97% of the incident radiation is absorbed, the transmission in both the visible and UV regions of the non-small particle absorber LTHC layers is far superior to the carbon black loaded LTHC layers having a substantially lower absorption at the imaging laser wavelength.

Example 3

A Prussian Blue LITI donor film, previously described as Example 2, Run 7, containing a radiation cured thermal transfer element including Prussian Blue pigment as an imaging radiation absorber material dispersed at 21.6% pigment loading in a 2.75 micrometer thick LTHC was used to pattern the emitting layer of an OLED device.

Receptor substrates were prepared on ITO-coated glass (0.7 mm thick) (ITO is available from ULVAC Technologies in Methuen, Mass. as S-ITO (150NM)). The substrate was spin coated with Baytron P VP CH8000 (H. C. Starck, Newton, Mass.) in order to achieve a dry thickness of approximately 60 nm and then heated to 200° C. for 5 minutes in a nitrogen purged oven. The coated substrate was then spin coated with a solution of H™-001 (a hole transporting polymer from Covion Organic Semiconductors GmbH, Frankfurt, Germany), and toluene while in an argon purged glove box to achieve a dry thickness of approximately 100 nm. Finally, an approximate 20 nm layer of spiro-TAD (Covion Organic Semiconductors GmbH, Frankfurt, Germany) was vacuum coated using a standard thermal evaporation procedure in a Balzers vacuum chamber at a background pressure of $10^{-7}$ Torr on the top to finish the receptor structure.

The LITI donor film, Example 2, Run 7 was vacuum coated using a standard thermal evaporation procedure in a Balzers vacuum chamber at a background pressure of $10^{-7}$ Torr with co-evaporation of the host and dye controlled to achieve the desired 30 nm thick layers of TMM004, a Covion proprietary OLED host, doped with 9 weight percent Irppy (iridium trisphenyl pyridine(Irppy), a green phosphorescent dye). The host/dye system was subsequently transferred from the donor sheet to the receptor surface using laser induced thermal imaging (LITI). The donor was imaged from the back side of the substrate using one single-mode Nd:YAG laser at a power of 1 watt at the imaging plane. Scanning was performed using a system of linear galvanometers, with the laser beam focused onto the image plane using an f-theta scan lens as part of a near-telecentric configuration. The laser spot size, measured at $1/e^2$ intensity was 18×250 microns. A unidirectional scan was used with a triangle dither pattern and a frequency of 400 KHz. Requested linewidths were 110 micron with a pitch of 165 microns. The transferred layer had good edge roughness with no visible evidence of thermal damage or centerline defects.

Device fabrication was completed by successively vacuum coating the following stack: Balq(100A)/Alq(200A)/LiF (7A)/Al(40A)/Ag(4000A) onto the LITI imaged receptor using a standard thermal evaporation procedure in a Balzers vacuum chamber at a background pressure of $10^{-7}$ Torr. The devices were encapsulated and tested for resultant light, current, and voltage characteristics. The corresponding OLED device showed a peak luminance efficiency of 5.5 Cd/A and a voltage of 6.5 V at 200 nits.

TABLE I

Coating Formulations (Example 1)

| Component | Small particle absorber (g) | Small particle absorber (Wt %) | Non-Small particle absorber (g) | Non-Small particle absorber (Wt %) | Interlayer Solution I (g) | Interlayer Solution II (g) |
|---|---|---|---|---|---|---|
| Pigment | | | | | | |
| Carbon Black | 8 | 3.6 | | | | |
| Prussian Blue | | | 16 | 7.9 | | |
| Diluent | | | | | | |
| TMPTA | 92 | 41.6 | 84 | 41.6 | 49.5 | 99 |
| Photoinitiator | | | | | | |
| Irgacure 369 | 1 | 0.5 | | | | |
| TPO | | | 2 | 1.0 | | |
| Esacure ONE | | | | | 0.5 | 1 |
| Solvent | | | | | | |
| PM acetate | 45.4 | 20.5 | 37.5 | 18.6 | | |
| Isopropyl acetate | 74.7 | 33.8 | 62.5 | 30.9 | 31.3 | 62.6 |
| Isopropanol | | | | | 18.7 | 37.4 |
| MEK | | | | | | 133.3 |
| Wt % Solids | 45.7 | | 50.5 | | 50 | 30 |

TABLE II

Pigment Loading in Dry Film (Example 1)

| Component | Small particle absorber (g) | Small particle absorber (Wt %) | Non-Small particle absorber (g) | Non-Small particle absorber (Wt %) |
|---|---|---|---|---|
| Pigment | | | | |
| Carbon Black | 8 | 7.9 | | |
| Prussian Blue | | | 16 | 15.7 |
| Diluent | | | | |
| TMPTA | 92 | 91.1 | 84 | 82.4 |
| Photoinitiator | | | | |
| Irgacure 369 | 1 | 1.0 | | |
| TPO | | | 2 | 2.0 |

TABLE III

Summary of Carbon Black and Prussian Blue Donor Film Analyses (Example 1)

| Run Identification | Interlayer (IL) Type | LTHC/IL Thickness (SEM, μm) | Extracted TMPTA (μg/cm²) | Extracted Acrylates* (μg/cm²) | Surface Roughness $R_q$ (25 μm²) | Surface Roughness $R_q$ (0.28 mm²) |
|---|---|---|---|---|---|---|
| Run 1 | — | 2.8 | 0.50 | 0.83 | 1.04 | 6.30 |
| Run 2 | TMPTA | 2.8/2.6 | 0.14 | 0.23 | 0.70 | 4.95 |
| Run 3 | — | 2.8 | 2.32 | 3.87 | 0.88 | 15.40 |
| Run 4 | TMPTA | 2.8/1.4 | 1.63 | 2.72 | 0.72 | 5.95 |

*estimate based on 60 wt % TMPTA in raw material

TABLE IV

Coating Compositions (Example 2)

| Component | Run 5 (g) | Run 6 (g) | Run 7 (g) | Run 8 (g) | Run 9 (g) |
|---|---|---|---|---|---|
| Pigment | | | | | |
| Carbon Black 9S928D | 74.81 | 59.85 | 164.58 | 14.96 | 32.88 |
| Diluent | | | | | |
| TMPTA | 225.20 | 90.15 | 135.42 | 235.10 | 217.12 |
| Photoinitiator | | | | | |
| TPO | 5.402 | 2.52 | 4.68 | 5.00 | 5.00 |
| Solvent | | | | | |
| Isopropyl acetate | 202.5 | 101.3 | 202.5 | 156.20 | 140.40 |

TABLE IV-continued

Coating Compositions (Example 2)

| Component | Run 5 (g) | Run 6 (g) | Run 7 (g) | Run 8 (g) | Run 9 (g) |
|---|---|---|---|---|---|
| Isopropyl alcohol | 97.5 | 48.7 | 97.5 | | |
| PM acetate | | | | 93.75 | 109.60 |
| Wt % Solids | 50.4 | 50.4 | 50.4 | 50.5 | 50.5 |

TABLE V

Composition of Dry Films (Example 2)

| Component | Run 5 (Wt %) | Run 6 (Wt %) | Run 7 (Wt %) | Run 8 (Wt %) | Run 9 (Wt %) |
|---|---|---|---|---|---|
| Carbon black | | | | 5.87 | 12.89 |
| Prussian Blue | 9.80 | 15.70 | 21.61 | | |
| TMPTA | 88.43 | 82.65 | 76.86 | 92.17 | 85.15 |
| TPO | 1.77 | 1.65 | 1.54 | 1.96 | 1.96 |

TABLE VI

Integrated Visible and UV Transmission of LTHC Layers[1] (Example 2)

| Imaging Radiation Absorber Material | Imaging Radiation Absorber Material Loading (Wt %) | Absorbance at 808 nm | Integrated Visible Light Transmission % $T_{VIS}$ | Integrated UV Light Transmission % $T_{UV}$ |
|---|---|---|---|---|
| Prussian Blue - Run 5 | 9.8 | 0.432 | 47.9 | 39.0 |
| Prussian Blue - Run 6 | 15.7 | 0.740 | 37.3 | 34.1 |
| Prussian Blue - Run 7 | 21.6 | 1.49 | 25.6 | 25.1 |
| Carbon black - Run 8 | 5.9 | 0.46 | 20.19 | 7.25 |
| Carbon black - Run 9 | 12.9 | 0.77 | 7.2 | 1.47 |

[1]Visible range defined as 400-700 nanometers; ultraviolet range defined as 300-400 nanometers

The invention claimed is:

1. A method of imaging a donor film onto a receptor using alignment through a light-to-heat conversion layer of the donor film, comprising:

providing a donor film comprising a substrate, a transfer layer, and a radiation curable light-to-heat conversion layer disposed between the substrate and the transfer layer in order to generate heat when the donor film is exposed to imaging radiation;

aligning the donor film with a patterned receptor and a laser system, including placing the donor film in intimate contact with the patterned receptor, wherein the light-to-heat conversion layer comprises an NIR dye or pigment as an imaging radiation absorber material, wherein the imaging radiation absorber material does not substantially absorb in a region used for the radiation curing of the light-to-heat conversion layer, and wherein the imaging radiation absorber material has sufficient transparency in the visible region in order to perform the alignment through the light-to-heat conversion layer;

imaging the donor film with the laser system in order to cause imagewise transfer of at least a portion of the transfer layer to the patterned receptor according to the alignment;

maintaining registration between the donor film and the patterned receptor when performing the imaging along a particular imaging path; and removing the donor film from the patterned receptor.

2. The method of claim 1, wherein the maintaining step includes using a sensor to detect fiducial marks on the patterned receptor.

3. The method of claim 1, wherein the transfer layer of the donor film comprises a pre-patterned transfer layer and wherein the aligning step includes aligning the donor film according to the pre-patterned transfer layer.

* * * * *